US009735784B2

(12) United States Patent
Kanno et al.

(10) Patent No.: US 9,735,784 B2
(45) Date of Patent: Aug. 15, 2017

(54) PROGRAMMABLE LOGIC DEVICE AND LOGIC INTEGRATION TOOL

(71) Applicant: Hitachi, Ltd., Chiyoda-ku, Tokyo (JP)

(72) Inventors: Yusuke Kanno, Tokyo (JP); Nobuyasu Kanekawa, Tokyo (JP); Kotaro Shimamura, Tokyo (JP); Tadanobu Toba, Tokyo (JP); Teppei Hirotsu, Tokyo (JP); Tsutomu Yamada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/025,821

(22) PCT Filed: Sep. 30, 2013

(86) PCT No.: PCT/JP2013/076467
§ 371 (c)(1),
(2) Date: Mar. 29, 2016

(87) PCT Pub. No.: WO2015/045135
PCT Pub. Date: Apr. 2, 2015

(65) Prior Publication Data
US 2016/0241247 A1 Aug. 18, 2016

(51) Int. Cl.
*H03K 19/177* (2006.01)
*H03K 19/21* (2006.01)
*H03K 19/00* (2006.01)

(52) U.S. Cl.
CPC ... *H03K 19/17764* (2013.01); *H03K 19/1776* (2013.01); *H03K 19/17728* (2013.01); *H03K 19/21* (2013.01)

(58) Field of Classification Search
CPC ....... H03K 19/17764; H03K 19/17728; H03K 19/1776; H03K 19/21; H03K 19/003
(Continued)

(56) References Cited

U.S. PATENT DOCUMENTS 6,777,978 B2 * 8/2004 Hart ..................... G06F 17/5054
257/E27.067
7,236,000 B1 * 6/2007 Steiner ............... H03K 19/0033
326/10
(Continued)

FOREIGN PATENT DOCUMENTS

JP 7-234801 A 9/1995
JP 2005-503668 A 2/2005
(Continued)

OTHER PUBLICATIONS

International Search Report (PCT/ISA/210) issued in PCT Application No. PCT/JP2013/076467 dated Nov. 12, 2013 with English translation (7 pages).

*Primary Examiner* — Dylan White
(74) *Attorney, Agent, or Firm* — Crowell & Moring LLP

(57) ABSTRACT

An object of the present invention is to provide a high reliable/high safe programmable logic device with high error resistance. The present invention provides a programmable logic device that has a plurality of configuration memories. The configuration memories are divided into a plurality of areas and are arranged and a part of the plurality of areas is set to a high reliable area where reliability of the configuration memory is higher than in the other area.

7 Claims, 15 Drawing Sheets

(58) Field of Classification Search
USPC .......................................... 326/9, 37–41, 47
See application file for complete search history.

(56) References Cited

U.S. PATENT DOCUMENTS

| | | | |
|---|---|---|---|
| 7,400,167 B2* | 7/2008 | Lewis | H03K 19/17784 326/38 |
| 8,630,976 B2* | 1/2014 | Muller | G06F 17/30445 707/609 |
| 8,952,723 B2* | 2/2015 | Aoki | H03K 19/017581 326/40 |
| 9,275,180 B1* | 3/2016 | Karp | G06F 17/5054 |
| 2003/0122578 A1* | 7/2003 | Masui | G06F 21/76 326/39 |
| 2012/0274355 A1* | 11/2012 | Nishijima | H03K 19/17728 326/41 |

FOREIGN PATENT DOCUMENTS

| | | |
|---|---|---|
| JP | 2007-53761 A | 3/2007 |
| WO | WO 03/025804 A2 | 3/2003 |

* cited by examiner

PROGRAMMABLE LOGIC DEVICE AND LOGIC INTEGRATION TOOL

TECHNICAL FIELD

The present invention relates to a programmable logic device and a logic integration tool.

BACKGROUND ART

Recently, with advancement of automation of control, demands of safety and reliability for an electronic control device increase. To secure the safety of the electronic control device, it is required to detect abnormality and stop an operation immediately, when the abnormality occurs.

Conventionally, a logic circuit is often realized by an application specified integrated circuit (ASIC) based on a cell-based integrated circuit (CBIC) providing fixed logic or a gate array. Particularly, in a high reliable/high safe system, the logic circuit is generally realized by a device of the fixed logic. For example, in PTL 1, technology for realizing the high reliable/high safe system by a self check of a comparator is disclosed.

However, recently, with improvement of integration according to Moore's Law, a cost of designing and manufacturing a mask to manufacture the ASIC tends to increase and it is predicted that the ASIC cannot be applied unless products are not mass-produced. Particularly, in the high reliable/high safe system to be a target of the present invention, an amount of production is limited by the specialty of a use.

Therefore, a use of a programmable logic device (PLD) such as a field programmable gate array (FPGA) where an initial expense is suppressed at the time of manufacturing is expected. A feature of the programmable logic device is that the programmable logic device can be held in a memory (configuration memory: CRAM) capable of rewriting logic information and logic can be set at a user side later. Particularly, a high integrated FPGA mainly has a structure in which the memory is held by a static random access memory (SRAM). Hereinafter, such a type of programmable logic device is called an SRAM-based programmable logic device.

CITATION LIST

Patent Literature

PTL 1: JP Patent Publication (Kokai) H07-234801 A (1995)

SUMMARY OF INVENTION

Technical Problem

However, there is a problem in the SRAM-based programmable logic device in that, because logic information (configuration information) of the programmable logic device is stored in the SRAM, soft error resistance is low and a mission-critical industry application is disabled.

Accordingly, an object of the present invention is to provide a high reliable/high safe programmable logic device with high error resistance.

Solution to Problem

According to the present invention, a programmable logic device includes a plurality of configuration memories, wherein the configuration memories are divided into a plurality of areas and are arranged, and a part of the plurality of areas is set to a high reliable area where reliability of the configuration memory is higher than reliability in the other area.

Advantageous Effects of Invention

According to the present invention, a high reliable/high safe programmable logic device with high error resistance can be provided.

DESCRIPTION OF EMBODIMENTS

The present inventors have paid attention to high reliability of a configuration memory (hereinafter, it may be called a CRAM) with low resistance to a soft error, when a high reliable/high safe programmable logic device with high error resistance is examined. In a logic LSI, there is a circuit such as a flip-flop and a latch as a storage element. However, it is known that the circuit has a size larger than a size of an SRAM memory cell and has soft error resistance higher than soft error resistance in the SRAM. In addition, in an SRAM memory integrated into the logic LSI, parity or an error correction code (ECC) is added and systemic detection or correction is enabled with respect to inversion of SRAM bits. One CRAM holds data after setting the data, has difficulty in performing monitoring by the ECC, and is vulnerable to bit inversion of memory cells.

The present inventors have found that a portion in which reliability in a single element of hardware is important as an essential factor for an LSI and a portion in which the reliability is not so important in terms of hardware when the reliability is secured in terms of a system exist, during the examination. A portion in which high reliability is necessary is a register to store information becoming a key or a comparator to compare multiplexed operation results. Because reliability improvement by redundancy is enabled by multiplexing or encoding in one operation portion, high reliability as a device is not necessarily required.

According to the technical spirit, a programmable logic device according to this embodiment has a plurality of configuration memories, the configuration memories are divided into a plurality of areas and are arranged, and a part of the plurality of areas is set to a high reliable region where reliability of the configuration memory is higher than the reliability in the other area. In addition, an operation part to execute operation processing is provided in the other area and an operation result processing part to process an operation result operated by the operation part is arranged in the high reliable region.

Hereinafter, embodiments of the present invention will be described using the drawings. An SRAM-based FPGA is exemplified as the programmable logic device hereinafter. However, content of each embodiment can be applied to a programmable LSI and a semiconductor that allow a user to program logic later.

First Embodiment

Figure 1:
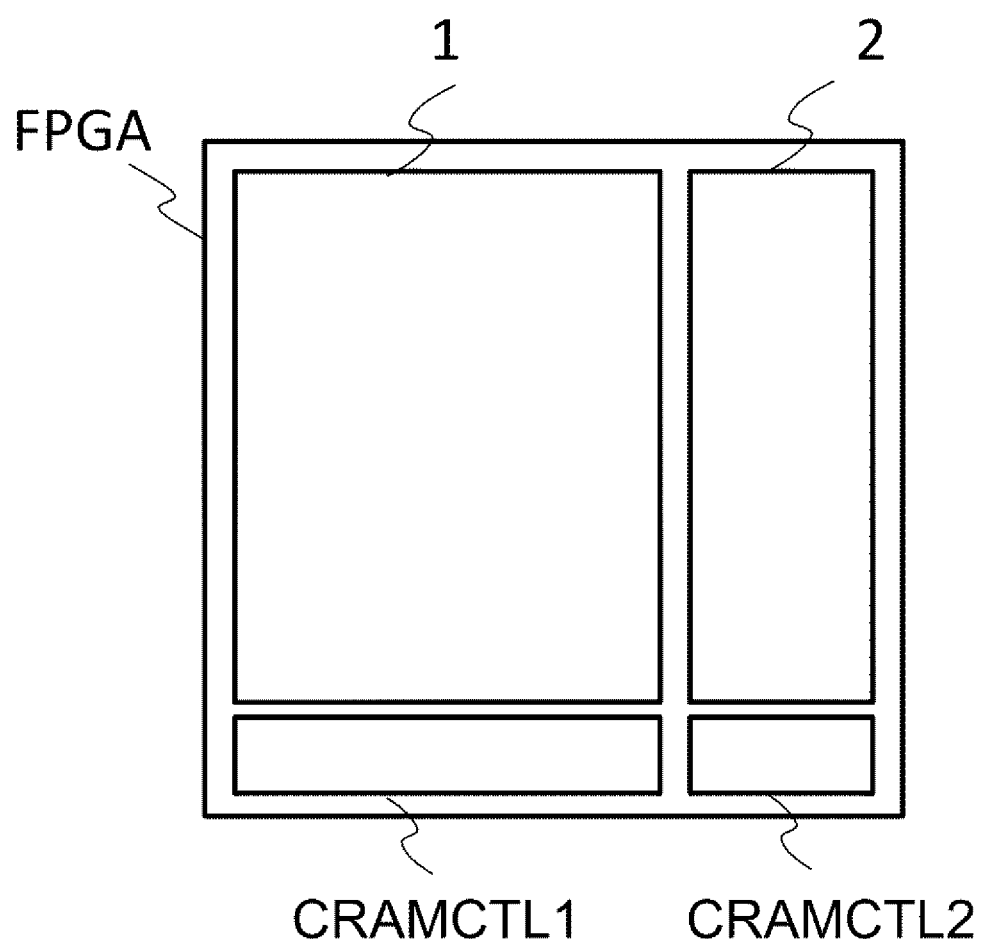
FIG. 1 illustrates a structural view of an FPGA according to a first embodiment.

An FPGA according to this embodiment is illustrated in FIG. 1. The FPGA is configured by integrating a plurality of logic elements into a tile shape. In addition, the FPGA is divided into at least two areas. In addition, one of the two areas corresponds to the high reliable area and becomes a high reliable mounting part 2 to be a portion where high reliability is secured with respect to a soft error. The other corresponds to the other area and becomes a large-capacity logic mounting part 1 to be a portion where operation logic to realize functions of a device is integrated. The large-capacity logic mounting part 1 becomes a portion where reliability is low as compared with the high reliable mounting part 2. However, in this embodiment, importance is placed on that logic is mounted at high density.

In this embodiment, in the high reliable area, the check frequency of the CRAM is set higher than the check frequency of the other area. Specifically, in this embodiment, checks of the CRAMs integrated into the individual areas are executed independently and CRAM control parts CRAMCTL1 and CRAMCTL2 checking whether data stored in the CRAMs are destructed are provided for the CRAMs. For the check of the CRAM, a CRC check in which a hardware scale is small and high-speed detection is enabled is generally known. Even in this embodiment, the corresponding technology can be used. Hereinafter, a check method of the CRAM will be described in detail.

As described above, a physical amount is small in a place where circuit reliability needs to be secured, in the FPGA. That is, a general logic circuit can improve reliability by an operation with an error correction code or redundancy such as duplication and triplication, known from the past. Meanwhile, a portion holding setting as the LSI or a comparison circuit of an operation result increases reliability of a circuit itself, which results in contributing to improving availability or safety of the whole device. Therefore, reliability and safety of the whole device can be increased by increasing reliability of some circuits of circuits integrated into the FPGA, in terms of the device and the circuit.

At the time of considering the SRAM-based FPGA, it is important to improve soft error resistance of the SRAM. For the soft error resistance of the SRAM, a size increase of the memory cell or a voltage increase of a power supply voltage is known. In the previous FPGA, because priority is given to versatility, it is important to cause the FPGA to have a homogeneous configuration. Different from an ASIC, architecture capable of mounting high-density (or large-capacity) logic is important in the FPGA inferior in a mounting rate, at the time of comparison in the same process and the same chip size. However, it has been found that reliability can be greatly improved while versatility is secured in a heterogeneous configuration, not the homogeneous configuration, when the reliability in the LSI is considered.

Figure 2:
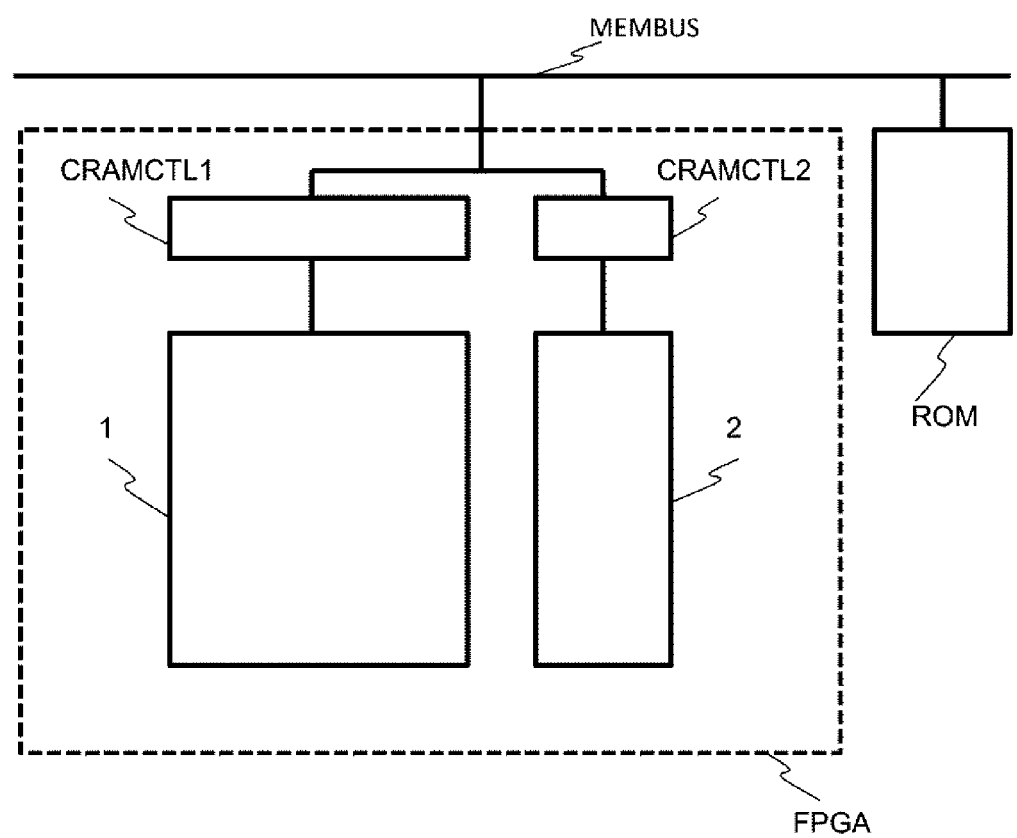
FIG. 2 illustrates a connection view of a CRAM and a ROM of the FPGA according to the first embodiment.

FIG. 2 illustrates a connection example of the CRAM in the FPGA according to this embodiment and a nonvolatile ROM provided outside the FPGA. The FPGA according to this embodiment can be configured to be connected to the nonvolatile ROM such as Flash via a memory bus MEM-BUS executing data transfer for CRAM access. In this way, the high reliable mounting part 2 and the large-capacity logic mounting part 1 can be integrated into the FPGA without increasing a hardware scale.

In this embodiment, because access hosts on the ROM are plural, like the CRAM control parts CRAMCTL1 and CRM-CTL2, arbitration is necessary. In this case, to give priority to ROM access from the CRAM control part CRMCTL2 of the high reliable mounting part 2, a signal line may be added separately or an identification signal may be included in a header portion of transfer data and priority may be given to the data transfer when the destination of the data becomes the high reliable mounting part 2.

Figure 3:
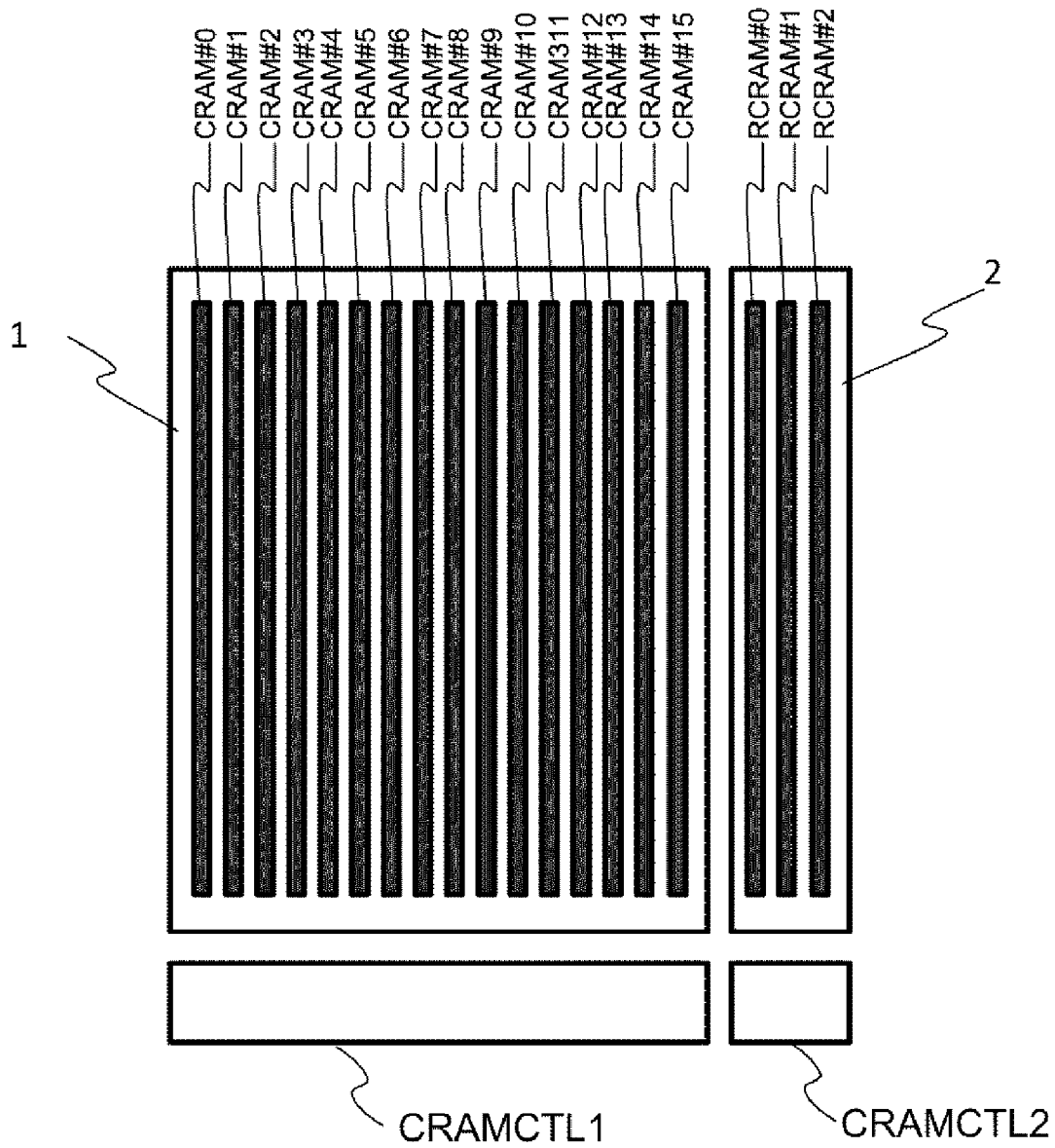
FIG. 3 illustrates an arrangement view of the CRAM of the FPGA according to the first embodiment.

FIG. 3 illustrates a physical arrangement of the CRAM in the FPGA. In the FPGA, generally, memory cell columns configuring the CRAM and logic circuits such as switches are alternately arranged. As the memory cell columns of the CRAM, a plurality of memory cell columns are arranged in a longitudinal direction of a chip. In this embodiment, an arrangement of the memories is divided physically and the memories are divided into the large-capacity logic mounting part 1 and the high reliable mounting part 2 and are integrated into the LSI chip. That is, in the large-capacity logic mounting part 1 and the high reliable mounting part 2, a plurality of cell columns in which the CRAMs are arranged in series are provided. In an example of FIG. 3, for simplification, 16 CRAM memory cell columns (CRAM#0 to CRAM#15) are integrated into the large-capacity logic mounting part 1 and three CRAM cell columns (RCRAM#0 to RCRAM#2) with high reliability are integrated into the high reliable mounting part 2. In this embodiment, the CRAM with the high reliability is represented as a reliable CRAM (RCRAM).

In this drawing, the large-capacity logic mounting part 1 is integrated at a left side of a plane of paper and the high reliable mounting part 2 is integrated at a right side thereof. However, the high reliable mounting part 2 may be integrated at the left side and may be divisionally integrated at the left and right sides. In addition, the high reliable mounting part 2 can be divisionally arranged on and below the chip.

In this configuration, the CRAM control part CRAM-CTL1 corresponding to the large-capacity logic mounting part 1 executes a check of storage data sequentially for CRAM#0 to CRAM#15. In addition, the CRAM control part CRAMCTL2 corresponding to the high reliable mounting part 2 executes a check sequentially for RCRAM#0 to RCRAM#2.

Figure 4:
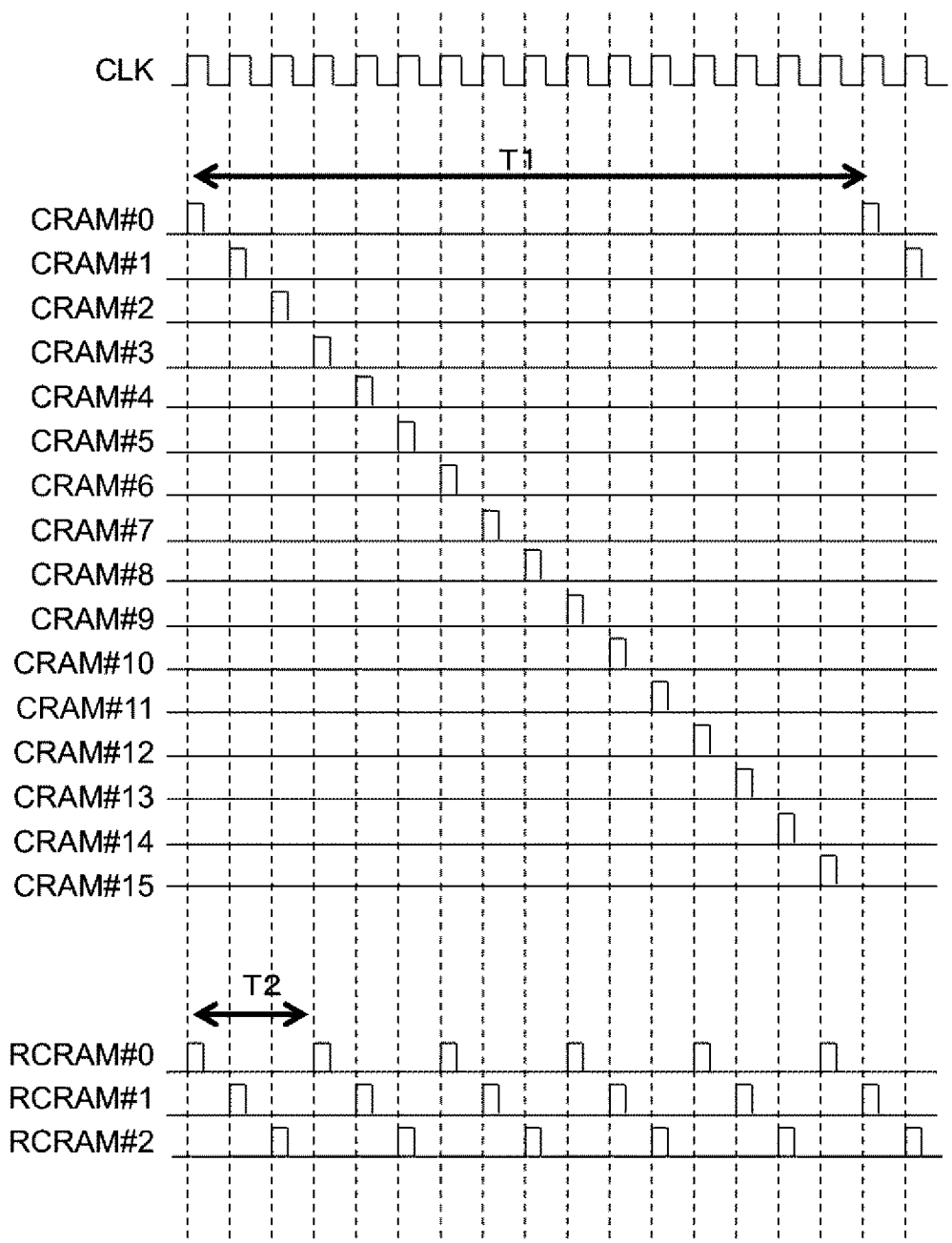
FIG. 4 illustrates an operation waveform diagram of CRAM control of the FPGA according to the first embodiment.

FIG. 4 illustrates a timing chart of the CRAM access. In this example, 16 CRAM cell columns are checked for the large-capacity logic mounting part 1 and 3 CRAM memory cell columns are checked for the high reliable mounting part 2.

The CRAM control part CRAMCTL1 executes a check sequentially for CRAM#0 to CRAM#15 in synchronization with an operation clock of the CRAM control part CRAMCTL1. After the check is executed until CRAM#15, the check is executed again from CRAM#0. In this example, an inspection cycle of the CRAM control part CRAMCTL1 is set as T1. Meanwhile, in this drawing, the three CRAM memory cell columns are checked for the high reliable mounting part 2. Here, if RCRAM#0, RCRAM#1, and RCRAM#2 are sequentially checked and the check of RCRAM#2 ends, the check is executed again from RCRAM#0. At this time, a check cycle is T2. In this way, because T2<T1 is satisfied, a check cycle of the high reliable mounting part 2 can be fixed without depending on an integration capacity of the large-capacity logic mounting part 1 and the check and recovery of the CRAM of the high reliable mounting part 2 can be executed quickly, which results in leading to high reliability and high safety of the whole LSI.

As such, in the first embodiment, the reliability is improved by setting the check cycle of the high reliable mounting part 2 to be shorter than the check cycle of the large-capacity logic mounting part 1. Therefore, the CRAMs of the large-capacity logic mounting part 1 and the high reliable mounting part 2 can be configured using transistors manufactured on the basis of the same design process and the same design rule and the memory cell sizes can be configured equally. However, like a second embodiment to be described below, a method of forming the CRAM of the high reliable mounting part 2 bigger than the large-capacity logic mounting part 1 may be adopted.

Figure 5:
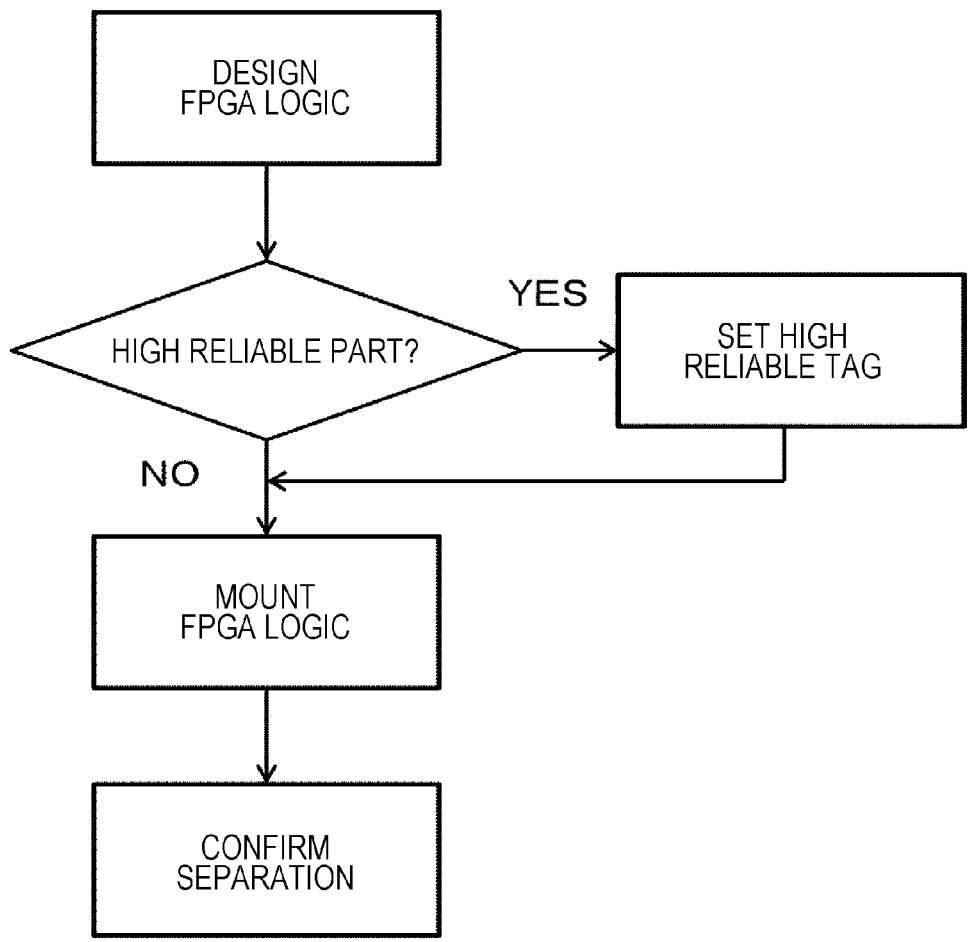
FIG. 5 illustrates a flow diagram of division of logic integrated into the FPGA according to the first embodiment.

FIG. 5 is a diagram illustrating a design flow of a logic design using the FPGA according to this embodiment. When the logic is integrated into the FPGA according to this embodiment, functional logic mounted on the FPGA is designed by a description language such as a register transfer level (RTL), similar to conventional technology. At this time, the functional logic can be designed by a high-level language such as a host C language. When this embodiment is used, a degree of reliability is defined with respect to the designed logic and an identification tag showing the degree of reliability is added to a designed RTL. For example, it is considered that a symbol meaning integration on the high reliable mounting part 2 is added to a functional block, in high reliable logic. That is, an identification tag showing whether a logic integrated target area is the high reliable mounting part 2 or the large-capacity logic mounting part 1 is included in data of the logic integrated into the FPGA.

Then, the logic integration is executed by a logic integration tool after selection of the high reliable mounting part 2 ends. At this time, the logic integration tool executes integration of the logic with respect to the large-capacity logic mounting part 1 and the high reliable mounting part 2, on the basis of the identification tag.

Finally, a delay analysis in the whole chip or separation mounting of the logic from the viewpoint of the reliability is confirmed and the design ends.

The high reliable mounting part 2 has an amount of logic smaller than an amount of logic mounted on the large-capacity logic mounting part 1 in the logic mounted on the LSI. However, a design having versatility is preferable as the FPGA design. Preferably, a capacity of the high reliable mounting part 2 may be secured by a constant amount and may be defined. In this case, if logic integration is executed in an empty area of the large-capacity logic mounting part 1 even in logic that does not need to be mounted on the high reliable mounting part 2, hardware resources of the LSI can be efficiently used.

Second Embodiment

Figure 6:
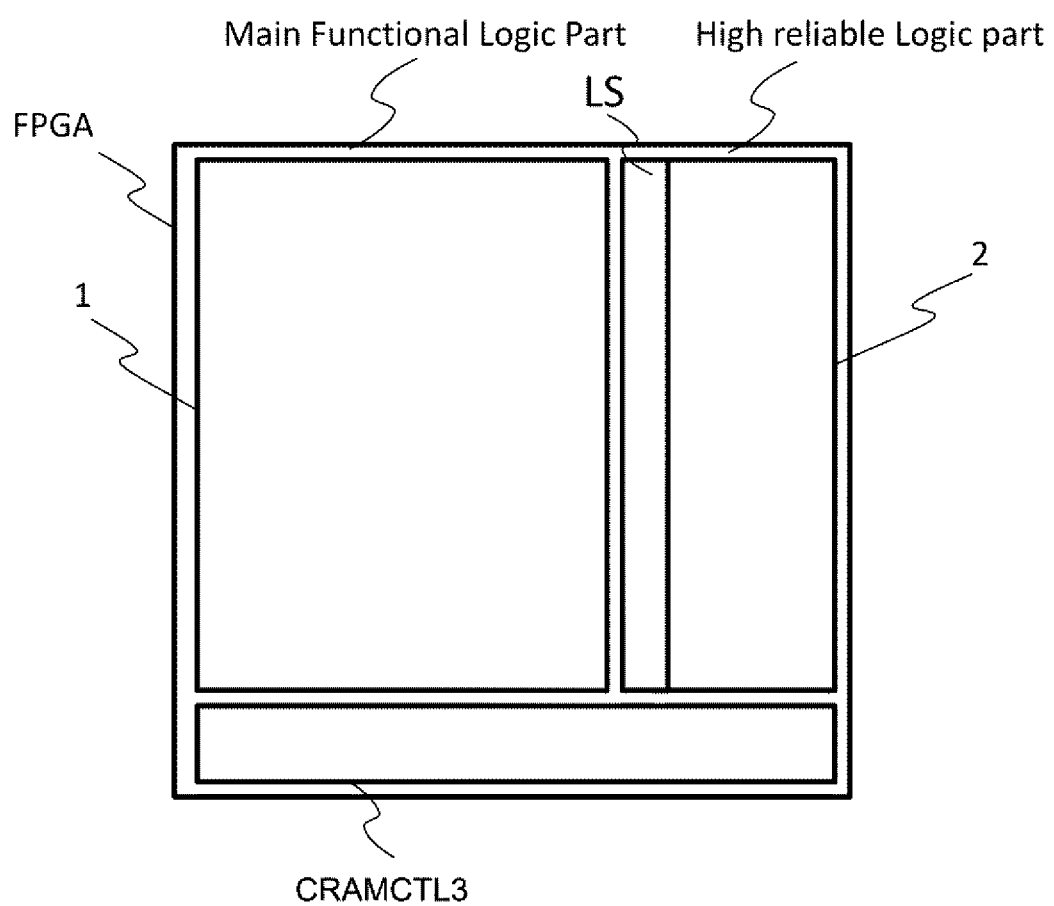
FIG. 6 illustrates a structural view of an FPGA according to a second embodiment.

An FPGA according to this embodiment is illustrated in FIG. 6. Even in this embodiment, a large-capacity logic mounting part 1 and a high reliable mounting part 2 are provided. The high reliable mounting part 2 uses a CRAM having a relatively large transistor size, is configured such that a thickness of a gate insulating film of a MISFET to be formed is large, and endures application of a high voltage. As a result, a high power supply voltage is set to the CRAM of the high reliable mounting part 2 as compared with a CRAM of the other area. As compared with the first embodiment, a signal level conversion circuit LS is added.

According to this embodiment, because the CRAM of the high reliable mounting part 2 can be designed to have a large holding charge amount as compared with a CRAM of the large-capacity logic mounting part 1, the CRAM can have high resistance to charge accumulation by the entry of charged particles caused when radiations such as neutrons collide other atomic nucleus. Although not illustrated in the drawings, a capacitive element can be added. A capacitor may be configured using a gate or the capacitor may be configured using a wiring layer.

For an influence of a neutron soft error on an SRAM in the transistor size, there is a report that the number of events that occur a multi-bit error in the case of using a transistor of a node of 22 nm is about 2500 times higher than that of in the case of using a transistor of a node of 180 nm. In addition, in the case of a transistor of a node of 90 nm, resistance is lower by about 10 times than resistance in the transistor of the node of 22 nm. That is, if a large transistor is used, a soft error rate can be suppressed low by 1 to 2 digits or more.

In this embodiment, the high reliable mounting part 2 is configured using a relatively large transistor, on the basis of the above principle. At this time, if soft error resistance of a CRAM single element of the high reliable mounting part 2 can be improved by about one digit as compared with soft error resistance of a CRAM single element of the large-capacity logic mounting part 1, a check mechanism of the CRAM can set the CRAM check frequency of the high reliable mounting part 2 relatively high, because a mean time to failure (MTTF) of a CRAM memory cell of the high reliable mounting part 2 is longer than an MTTF of a CRAM memory cell of the large-capacity logic mounting part 1, even though a method of checking each CRAM memory cell column sequentially and cyclically by one CRAM control part CRAMCTL3 is taken in a chip. In addition, like the first embodiment, a CRAM control part may be provided independently in each of the high reliable mounting part 2 and the large-capacity logic mounting part 1.

Figure 7:
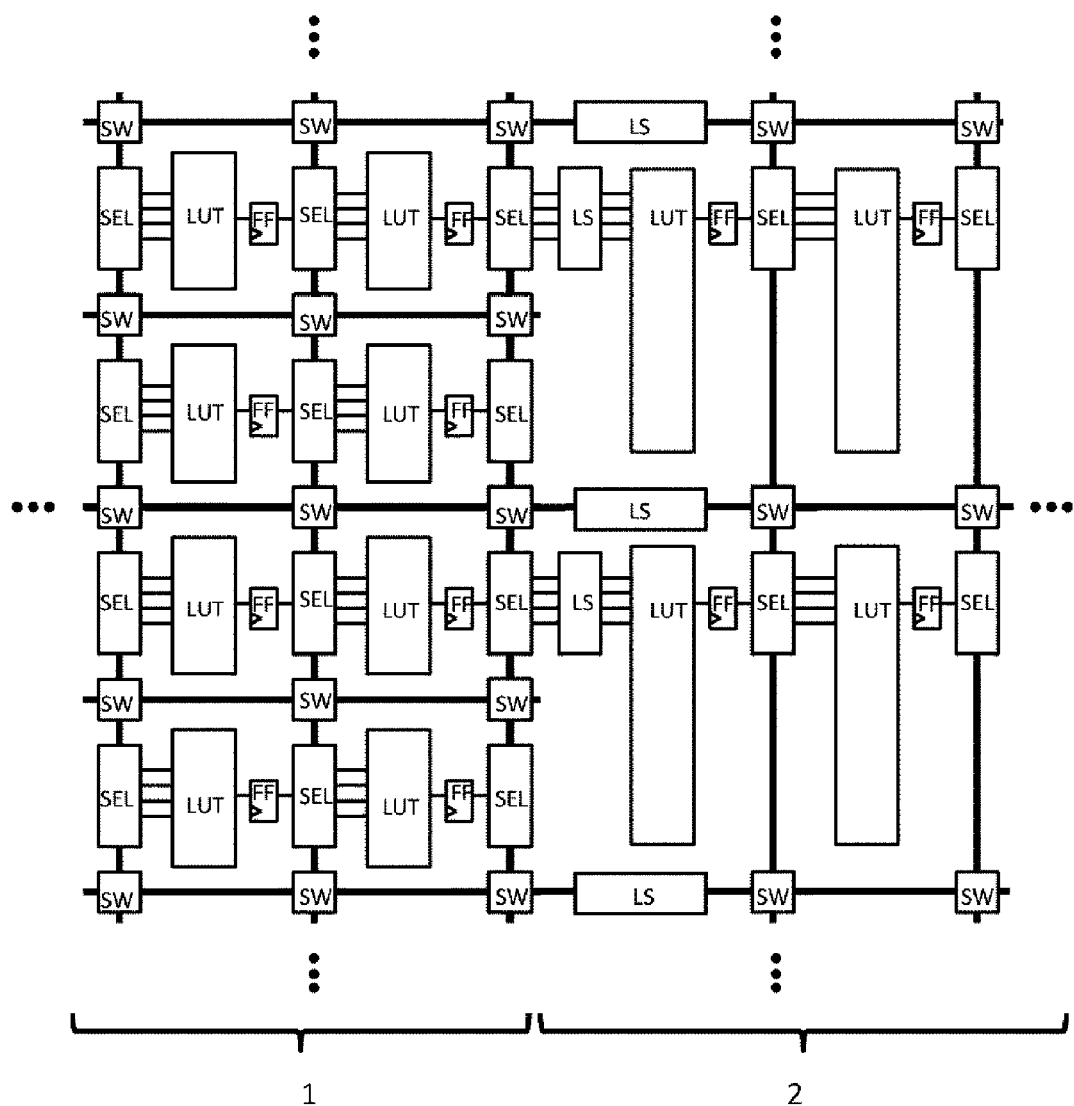
FIG. 7 illustrates an arrangement view of a logic element of the FPGA according to the second embodiment.

An integration example of a logic element in an LSI to realize this embodiment is illustrated in FIG. 7. In this drawing, an example of the case in which a transistor designed by a process node of 22 nm is arranged in the large-capacity logic mounting part 1 and a transistor designed by a transistor having about a double size of the size of the transistor (transistor before the second generation, namely, transistor corresponding to a process of 45 nm for a design rule) is arranged in the high reliable mounting part 2 is illustrated.

In this drawing, a lookup table LUT converts an input value from the lookup table LUT into an output value, according to bit information stored in the CRAM. An output of the lookup table LUT is taken in a flip-flop FF and is connected to a next lookup table LUT. A selector SEL is a circuit to switch connection of a wiring line and the lookup table LUT and is switched by a bit stored in the CRAM. Connection switching between wiring lines is executed by a switch SW.

Because a power supply voltage is different on interfaces of the large-capacity logic mounting part 1 and the high reliable mounting part 2, signal level conversion circuits (LS: Level Shifter) need to be provided on boundaries thereof. In this example, the signal level conversion circuits LS are provided between the lookup table LUT and a rear step of the selector to switch connection of the wiring line and between a switch of the large-capacity logic mounting part 1 and a switch of the high reliable mounting part 2. If a signal level is converted once, the signal level conversion circuit is not needed in the high reliable mounting part 2 thereafter.

To further improve the soft error resistance to a neutron, it is preferable to perform a design using a transistor used for an I/O. In this case, a design is performed using a transistor corresponding to 130 nm or 180 nm and a cell having a size of 4 to 8 times is configured. Even in this case, elements may be arranged in a tile shape as illustrated in FIG. 7 in a form in which one cell of the high reliable mounting part 2 is arranged for every 4 to 8 cells of the large-capacity logic mounting part 1. Or, a cell long in a transverse direction in the drawing can be configured. In any case, even when transistor sizes are different, the elements can be arranged in a tile shape by an appropriate design and a circuit having high versatility as the FPGA can be designed.

Figure 8:
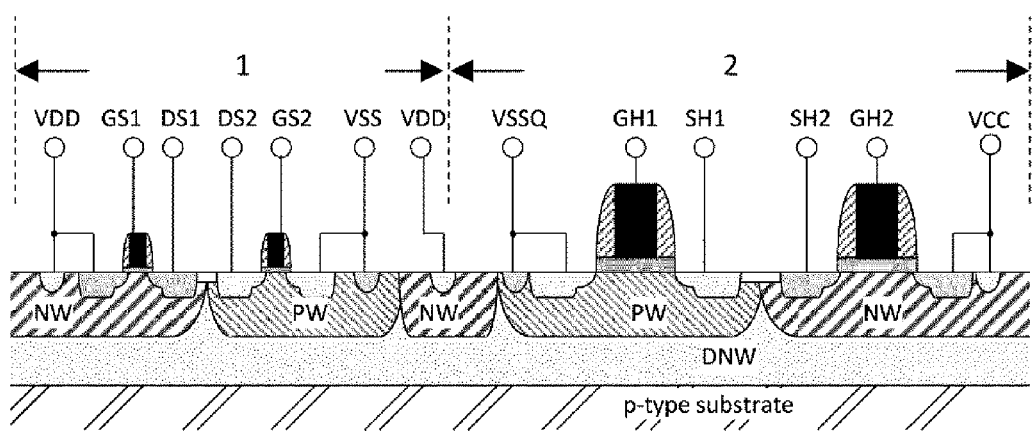
FIG. 8 illustrates a chip cross-sectional structure of a boundary portion of a high reliable mounting part and a large-capacity logic mounting part of the FPGA according to the second embodiment.

A transistor structure example configuring this embodiment is illustrated in FIG. 8. In this drawing, a P-type MISFET and an N-type MISFET are described for the large-capacity logic mounting part 1 and the high reliable mounting part 2. In this drawing, an example of a so-called triple well structure in which an N-type well is configured on a P-type substrate is illustrated. In this case, because a power supply voltage VCC of the high reliable mounting part 2 is higher than a power supply voltage VDD of the large-capacity logic mounting part 1, separation of an NMOS-side well is necessary.

According to this configuration, because a ground VSSQ of the high reliable mounting part 2 and a ground VSS of the large-capacity logic mounting part 1 can be separated, a ground noise of the high reliable mounting part 2 having the high power supply voltage can be prevented from being propagated to the large-capacity logic mounting part 1. By providing this configuration, power supply separation of the high reliable mounting part 2 is also enabled. In the reliability design, multiplexing of a power supply may be considered importantly. At this time, there is an effect of separating the power supply and performing the design.

The structure of the transistor is not limited to the triple well structure and the present invention can be applied to an LSI of a so-called dual well structure in which there is no deep N well. In this case, separation of the ground side may become difficult. However, a plurality of power supply voltages can be set.

As the CRAM used for the high reliable mounting part, a CRAM manufactured by a so-called process of a large diameter of the old process generation can be used. Generally, because a peripheral apparatus of a legacy voltage needs to be connected to a MOS configuring the I/O, a transistor of a large diameter is integrated into the same chip and is used, in the LSI of which the size is reduced. Therefore, this transistor can be used as the transistor of the process of the large diameter.

Third Embodiment

Figure 9:
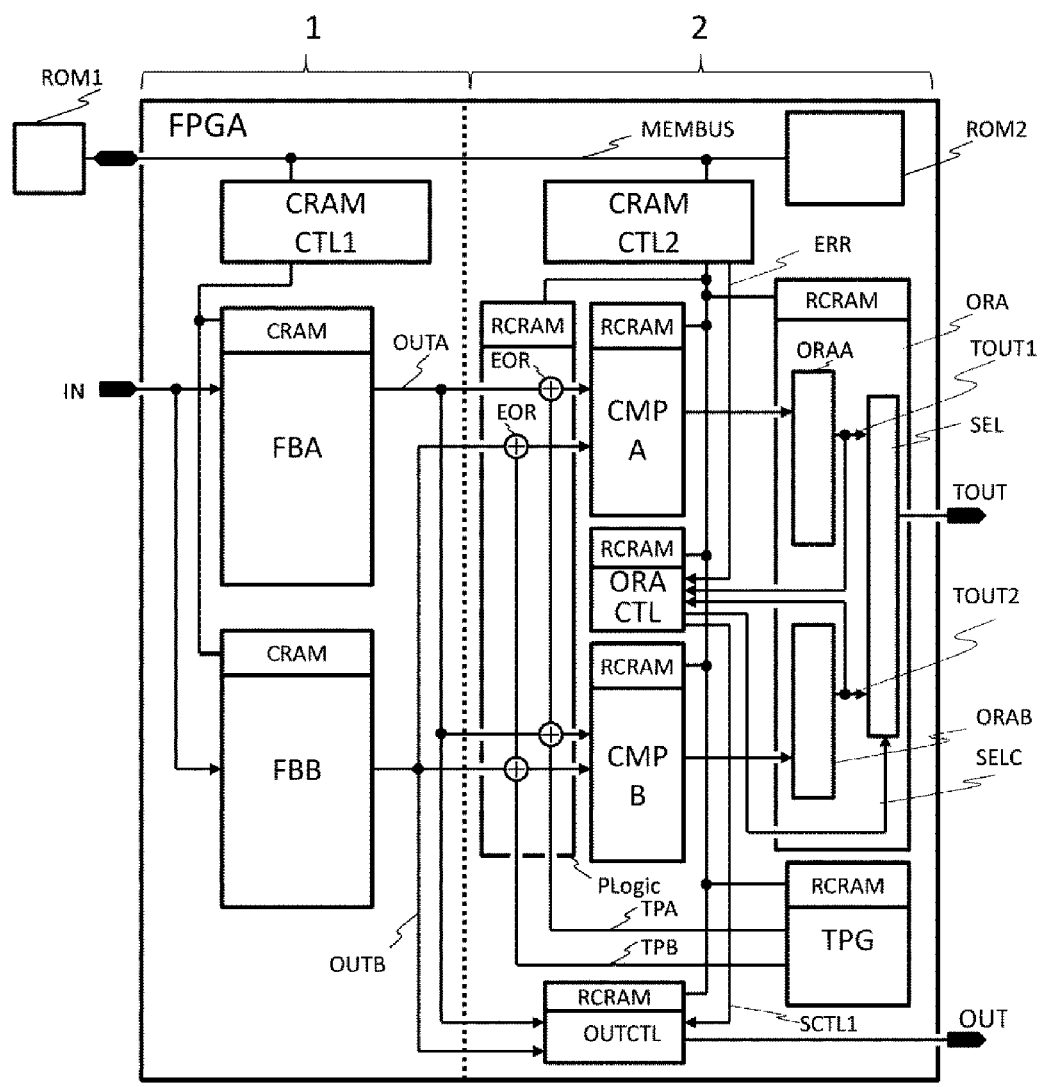
FIG. 9 illustrates a structural view of an FPGA according to a third embodiment.

An example of integration of a large-capacity logic mounting part 1 and a high reliable mounting part 2 of an FPGA according to this embodiment is illustrated in FIG. 9. In this embodiment, a plurality of comparators are multiplexed and provided. Specifically, the large-capacity logic mounting part 1 and the high reliable mounting part 2 are provided in the FPGA and functions are realized by a functional block FBA and a functional block FBB duplicated in the large-capacity logic mounting part 1. A CRAM to store logic information and wiring line switching information is defined in each of the functional blocks FBA and FBB. This drawing illustrates a physical relation such that the corresponding CRAMs become clear according to the functions, not a physical arrangement. In the CRAM, writing of data from a ROM and checking of storage information of the CRAM are executed by a CRAM control part 1CRAMCTL1. The high reliable mounting part 2 includes comparators CMPA and CMPB comparing signals from the functional blocks FBA and FBB, an output inspection part ORA (Output Response Analyzer) mainly used for a failsafe use, a test pattern generation circuit TPG for a self test to diagnose a failure of the functional blocks FBA and FBB and the comparators CMPA and CMPB, peripheral logic Plogic of wiring line switching, a selector SEL to output any one of the functional blocks FBA and FBB, and an output control circuit OUTCTL having a function of stopping an output OUT at the time of abnormality. Two systems are configured to improve availability for the comparators CMPA and CMPB and an ORA control part ORACTL to control the output inspection part ORA is provided. An EOR in the peripheral logic Plogic shows an exclusive OR circuit. In addition, TPA and TPB show a test pattern A and a test pattern B, respectively.

In this embodiment, when the two systems are configured, mapping is preferably executed such that a logic operation associated with the other RCRAM does not become disabled during a reconfiguration of one RCRAM. For this reason, as illustrated in FIG. 3, when memory cells of the RCRAM are arranged in a stripe shape in a longitudinal direction, the RCRAM storing logic of an A system and the RCRAM storing logic of a B system are arranged in different cell columns.

As such, the individual comparators CMPA and CMPB are arranged in different cell columns of a plurality of cell columns, so that the CRAMs are physically separated. Therefore, it is possible to cause read and write operations for the CRAMs not to be executed at the same timing. That is, the arrangement is enabled such that scrubbing (check of the CRAM storage information through read/write access on the CRAM) is not executed at the same timing.

Figure 10:
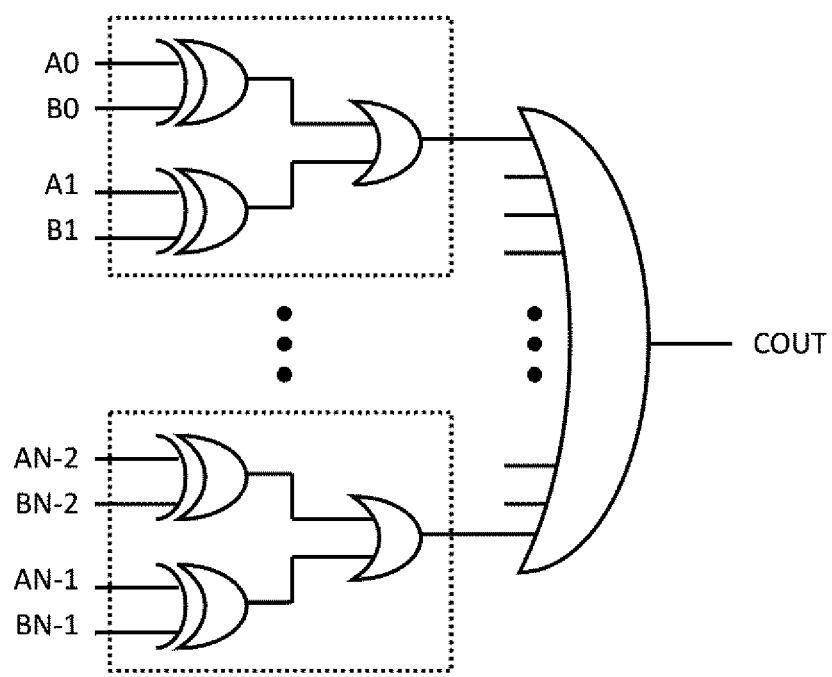
FIG. 10 illustrates a structural view of a comparator of the FPGA according to the third embodiment.

Each of the comparators CMPA and CMPB has a circuit configuration in which an exclusive OR circuit is used in an initial step and OR is arranged in a tree shape in a rear step thereof, as illustrated in FIG. 10. As a result, mismatching of signals transmitted from the functional blocks FBA and FBB can be detected and the mismatching can be transmitted to the outside by one output signal.

In the output inspection part ORA, inspection circuits ORAA and ORAB having a circuit configuration capable of inspecting outputs of the comparators CMPA and CMPB duplicated are provided and individual outputs TOUT1 and TOUT2 are input to CTL.

In the output inspection part ORA, to output any one of the output TOUT1 of the inspection circuit ORAA and the output TOUT2 of the inspection circuit ORAB to the outside of the LSI, the output TOUT1 of the inspection circuit ORAA and the output TOUT2 of the inspection circuit ORAB are switched by the selector SEL and are output. Switching of the selector SEL is executed by a control signal SELC from CTL.

In the ORA control part ORACTL, alternating signals to be outputs of the output TOUT1 of the inspection circuit ORAA and the output TOUT2 of the inspection circuit ORAB are observed and stop of the alternating signals is checked. Here, the alternating signal means a signal in which a high level and a low level of an output alternately appear. If operations of the comparators CMPA and CMPB are considered, a comparison result becomes 0 at the time of a normal operation, because the same signals from the two functional blocks FBA and FBB are compared with each other.

At this time, a test pattern to detect failures in the comparators CMPA and CMPB is applied as a signal of a level inversed to a level of one signal of input signals (that is, an erroneous operation signal is arbitrarily input to the comparators CMPA and CMPB), so that the failures of the comparators CMPA and CMPB are detected. This example is an example of the case in which a check of the comparators CMPA and CMPB is executed at the same time as rising of a clock and a comparison of data is executed at a falling time of the clock. In this case, the former is called a comparator check period and the latter is called a comparison signal comparison period. When a comparison result at the clock rising is 1, this shows a test pattern application time and in a normal state, "1" is obtained. When a comparison result at the clock falling is 0, this shows matching in the comparison of the data.

To output any one of the output TOUT1 of the inspection circuit ORAA and the output TOUT2 of the inspection circuit ORAB as an output TOUT, the outputs are switched by the SEL selector. At this time, control is executed by an error signal ERR from the CRAM control part CRAMCTL2. Although not illustrated in detail herein, if the error signal ERR is designed by a signal of two bits, it is possible to indicate which of CMPA and CMP2 has failed. Therefore, control of the selector SEL can be executed by SELC. At the same time, when failures of FBA and FBB are suspected at the time of the abnormality of the comparators, that is, when outputs of FBA and FBB are not matched in the comparison signal comparison period, output stop control of the output OUT is executed by an SCTL1 signal.

Corresponding CRAMs (RCRAMs) are associated with the various logic circuits integrated into the high reliable mounting part 2. The RCRAM is controlled by the CRAM control part CRAMCTL2.

In this embodiment, the CRAM control parts CRAMCTL1 and CRAMCTL2 are connected to the same memory bus MEMBUS, configuration data for each CRAM is stored in the ROM outside the FPGA or a storage circuit RAM1 in the FPGA, and the ROM and the RAM are also connected to the same memory bus. Although not illustrated in the drawings, the RAM1 is configured as a memory provided with an error detection and correction mechanism such as an ECC.

The reason why two kinds of ROM1 and RAM1 are provided is as follows. It is assumed that the ROM outside the FPGA is configured using a nonvolatile ROM such as Flash. In the ROM, neutron resistance is high, but so-called first access as access requires several tens of microseconds and a data access speed is low. Meanwhile, the RAM1 in the FPGA is basically an SRAM-based memory. In the RAM1, the neutron resistance is low, but high-speed access is enabled. However, because the RAM1 can be protected by the ECC in terms of a circuit, the neutron resistance can be increased. The embedded RAM is integrated into the high reliable mounting part 2. The RAM may be configured using a transistor having the high soft error resistance in terms of the device, similar to the CRAM having the high reliability, and may be configured as a ROM in which a high-speed operation is enabled.

For a basic operation for the high reliable comparator, the high reliable comparator may be operated as described in PTL 1. However, here, duplication is realized to improve availability of the comparators.

Figure 11:
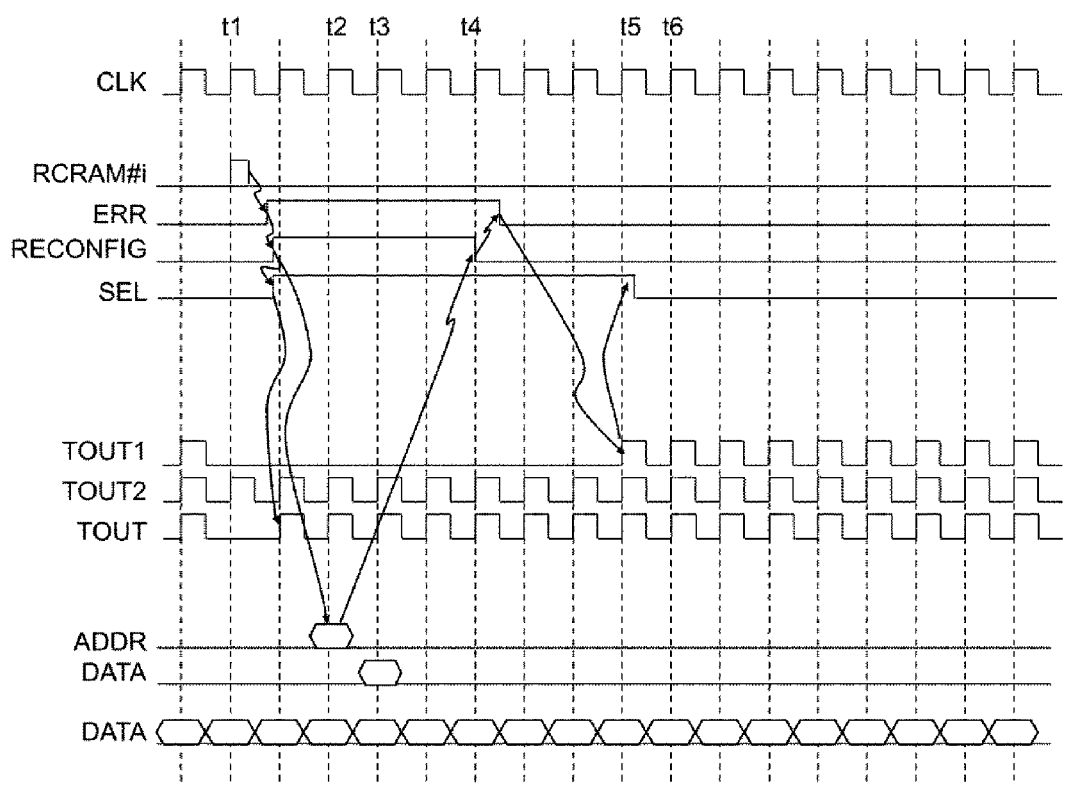
FIG. 11 illustrates an operation waveform diagram of CRAM control of the FPGA according to the third embodiment.

An operation waveform diagram of this embodiment is illustrated in FIG. 11. Here, the case in which an inspection of RCRAM#i is executed at a time t1 and there is a soft error in the CRAM will be described. At this time, an error occurs in the comparator CMPA and a normal output from the comparator CMPA is disabled in the output inspection part ORA. Therefore, an alternating signal to be an output signal of the inspection circuit ORAA is interrupted. It is assumed that error detection from a CRAM check can be executed at one cycle. However, several cycles may be taken. At this time, because the comparator CMPB is normal and outputs of the functional blocks FBA and FBB are matched, an output does not need to be stopped. For this reason, if a circuit to check both the alternating signals is provided in the output inspection part ORA, there is no disadvantage in realizing the functions of the device. For this reason, a system operation does not need to be stopped and an operation is continuously executed by switching the selector, such that an output of the comparator CMPB is input to the outside. This is controlled by SELC.

At the same time as when a level of the error signal ERR becomes a high level, an operation for writing normal configuration data from the RAM 1 to the RCRAM is executed by asserting a reconfiguration signal RECONFIG to execute rewrite of the CRAM. Here, rewrite from the RAM1 is described as increasing resistance to a multi-bit error. In a check by a CRC, because error correction of one bit is enabled, a high-speed return is enabled in the case of one bit correction.

In this example, because an embedded SRAM-based RAM is assumed as the RAM1, it is assumed that an address is calculated at one cycle from the error signal ERR, the address is transmitted to the RAM1 at a time t2, and data is received at a next cycle (time t3). Latency of data arrival may require several cycles according to a specification of a designed LSI. However, the latency is assumed as one cycle.

Then, data is written to RCRAM#i, write completion is received at a time t4, the reconfiguration signal RECONFIG is negated, and the error signal ERR is negated. Then, the output TOUT1 receives a normal alternating signal output at a time t5, an operation for returning the selector SEL to the side of the inspection circuit ORAA is executed, and a state returns to an original state at a time t6. At this time, because the inspection circuits ORAA and ORAB are equivalent, selection of the inspection circuit ORAB may be maintained. In this case, a duplex system of the comparators is returned at the time t4. However, the duplex system can be perfectly returned at the time t5 when the alternating signal of the inspection circuit ORAA is normally returned.

Here, because the output TOUT2 normally operates, it can be said definitely that abnormality is caused by the comparators CMPA and CMPB, even though the output TOUT1 abnormally operates at the time T1. Therefore, an output signal OUT is normally output without executing control to stop the output.

Fourth Embodiment

Figure 12:
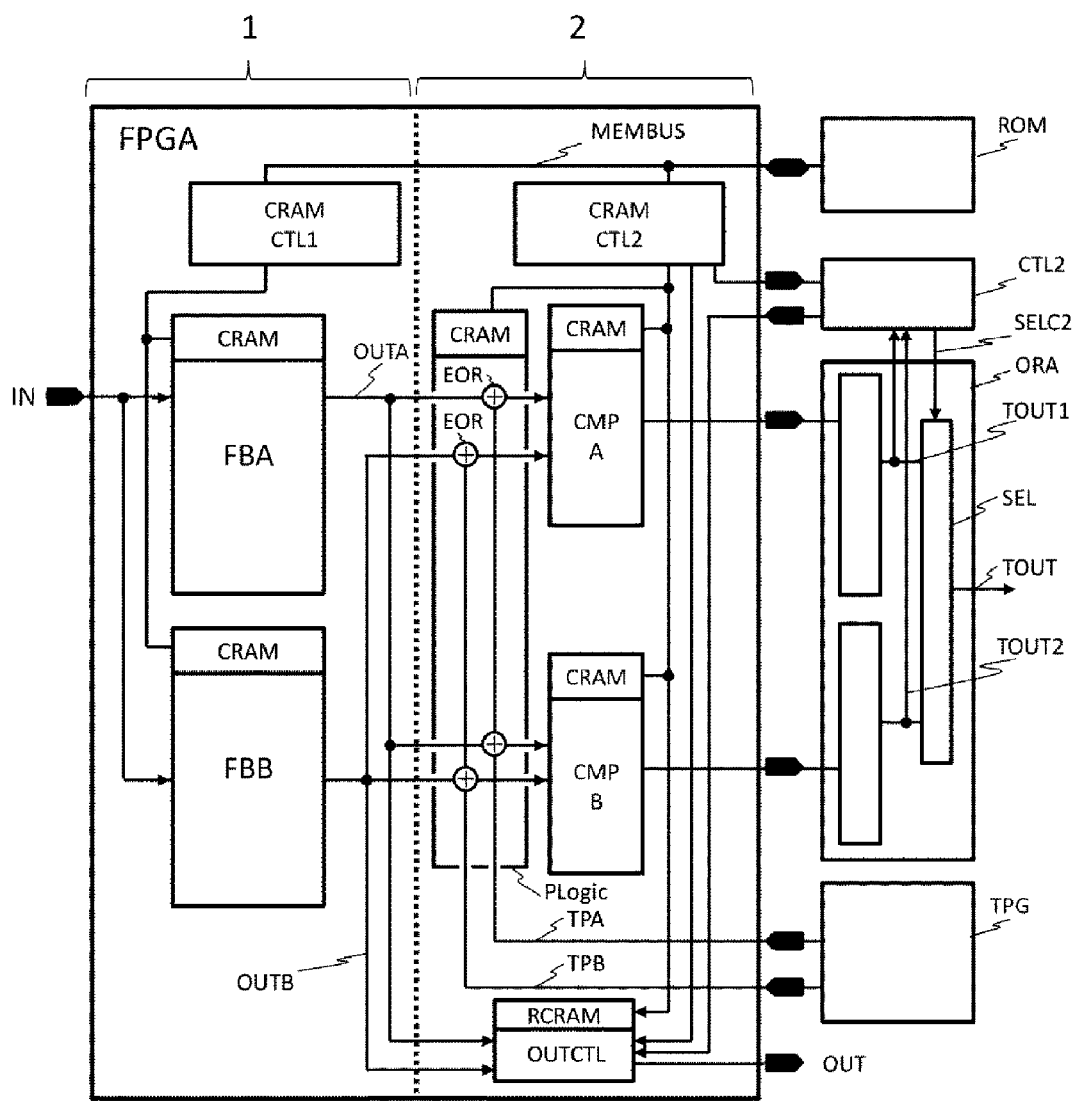
FIG. 12 illustrates a structural view of a comparator of an FPGA according to a fourth embodiment.

In this embodiment, as illustrated in FIG. 12, a ROM, an output inspection part ORA, and a test pattern generation circuit TPG provided in an FPGA in the configuration according to the third embodiment are provided outside the FPGA. In this embodiment, after an error is detected by a CRAM control part 2CRAMCTL2, an error signal ERR2 is transmitted to a control part CTL2. The control circuit CTL2 has a function of receiving the ERR2 signal and alternating signals TOUT11 and TOUT12 from the ORA, transmitting a control signal SCTL2 to a control circuit OUTCTL, and controlling output stop of an output OUT and a function of executing switching control of an alternating signal output selector in an ORA circuit by a control signal SELC. The CTL2 inspects the error signal ERR2 and the alternating signals TOUT11 and TOUT12 output from comparison circuits CMPA and CMPB. When there is abnormality in waveforms thereof, that is, when mismatching of comparators is detected during a comparison signal comparison period, the CTL2 executes control to stop an output. At this time, as described in the embodiment of FIG. 12, when any one of the comparison circuits CMPA and CMPB is normal and individual outputs of FBA and FBB are matched, the OUTCTL executes control to execute an output continuously and when there is abnormality in comparator outputs, the OUTCTL executes control to stop an output OUT for safety. In this case, because the CRAMCTL2 can determine which of the comparators is destroyed, recovery of the destroyed comparator is executed. In this embodiment, there is a merit in that circuits integrated into the FPGA can be reduced. In this embodiment, the output inspection part ORA is configured using a dedicated LSI or a versatile LSI. In this case, because the ORA or TPG can be configured using hardware logic, resistance to a soft error can be increased. Of course, the ROM may be provided in PGA.

Figure 13:
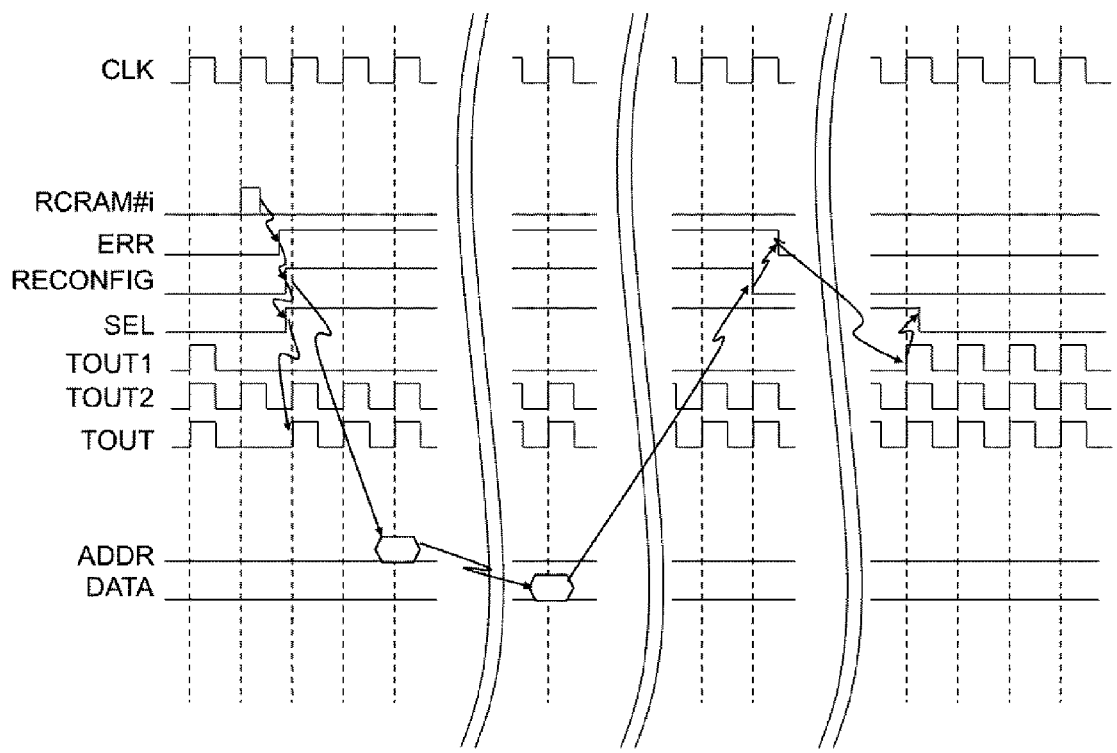
FIG. 13 illustrates an operation waveform diagram of CRAM control of the FPGA according to the fourth embodiment.

An operation example according to this embodiment is illustrated in FIG. 13. A basic operation is the same as the description in FIG. 11. In this embodiment, the externally attached ROM is accessed. For this reason, if a general flash ROM is used, several tens of microseconds are necessary for first access and a waiting time of order of several tens of microseconds is generated from address transmission (time t2') to data reception start (time t3'). The waiting time is different from that of FIG. 11.

FIG. 13 illustrates an example of the case in which a data transmission amount is large and when a data amount is large, a data transfer waiting time (time t3' to time t3") and a configuration time (time t4' to time t5') are also necessary. A high reliable mounting part 2 defines circuit mounting in a relatively small area, so that overheads of data transfer and configuration can be reduced.

Fifth Embodiment

Figure 14:
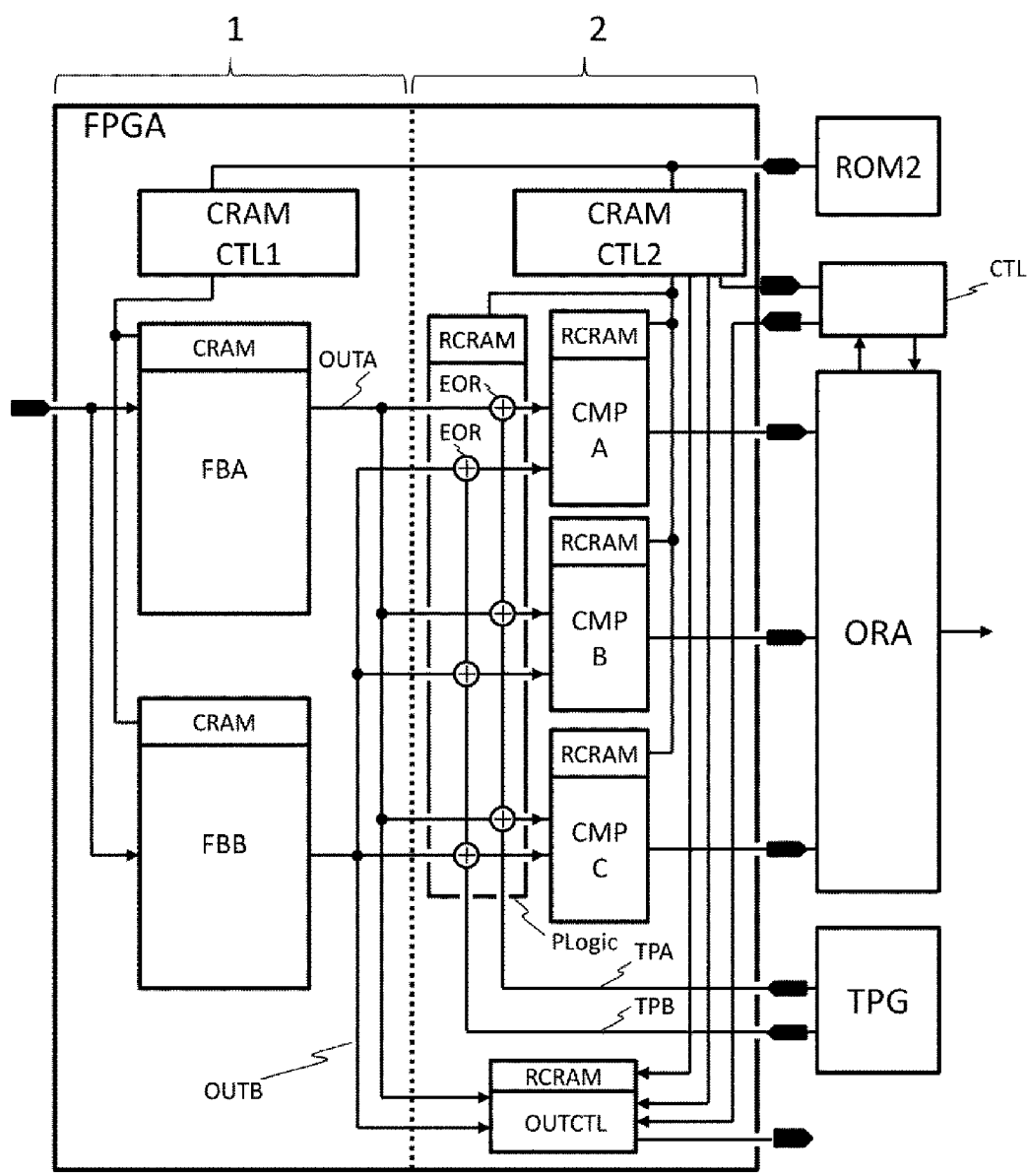
FIG. 14 illustrates a structural view of an FPGA according to a fifth embodiment.

This embodiment is illustrated in FIG. 14. In the present invention, comparators integrated into a high reliable mounting part 2 are triplicated. Even in this embodiment, the comparators are integrated into the high reliable mounting part 2. In this embodiment, after an error is detected by a CRAM control part 2CRAMCTL2, an error signal ERR3 is transmitted to a control part CTL3. The control circuit CTL3 has a function of receiving the ERR3 signal and an alternating signal TOUT3 [0:2] from an ORA, transmitting a signal SCTL3 to a control circuit OUTCTL, and controlling output stop of an output OUT and a function of executing switching control of an alternating signal output selector in an ORA circuit by a control signal SELC3. The CTL3 inspects the error signal ERR3 and three alternating signals TOUT3 [0:2] output from comparison circuits CMPA, CMPB, and CMPC. When there is abnormality in waveforms thereof, that is, when mismatching of the comparators is detected during a signal comparison period, the CTL3 executes control to stop an output. At this time, when any one of the comparison circuits CMPA, CMPB, and CPMC is normal and it is determined by majority decision that outputs of FBA and FBB are correct, the OUTCTL executes control to execute an output continuously. At this time, the defective comparator is recovered immediately. Meanwhile, when all comparator outputs are abnormal, control to stop an output OUT is executed for safety. Because the majority decision can be executed by taking triplication, recovery of a destroyed portion and continuous execution of operation processing can be easily executed, even though one of the comparators is failed.

Sixth Embodiment

Figure 15:
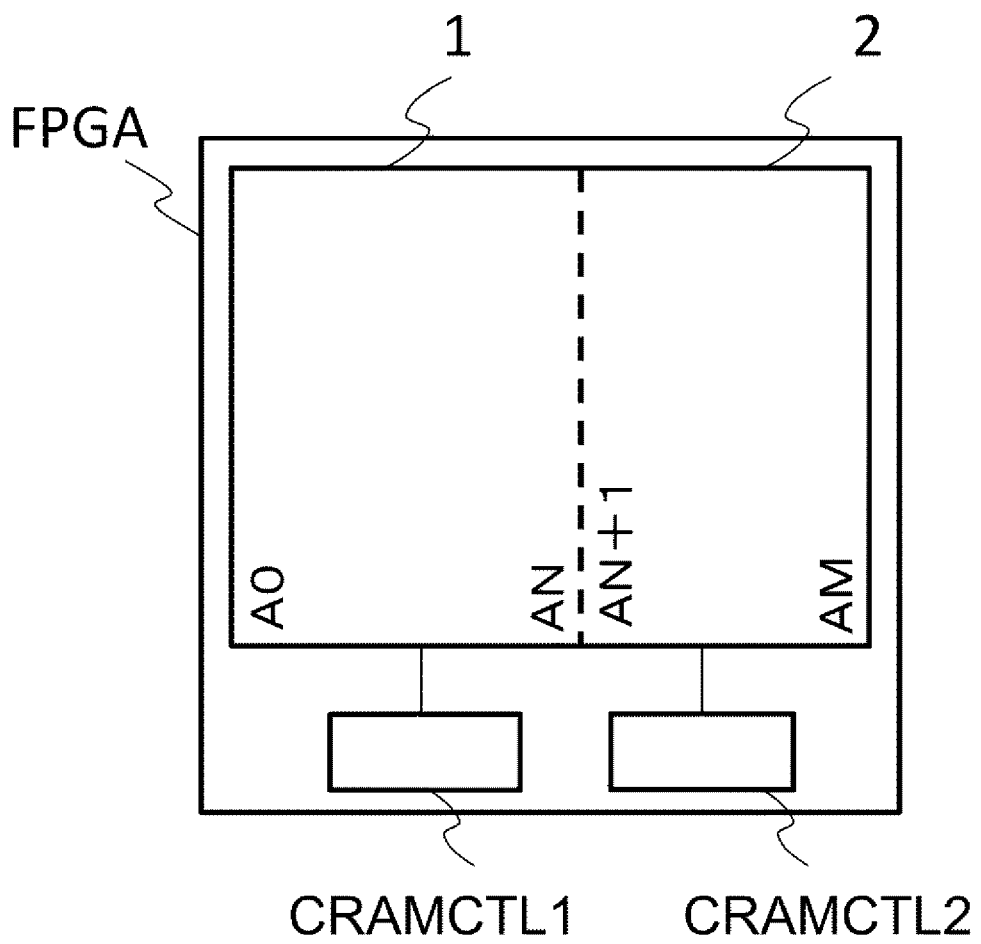
FIG. 15 illustrates a structural view of an FPGA according to a sixth embodiment.

As a modification of the first embodiment, an embodiment in which integration of a logic element part is not distinguished in a large-capacity logic mounting part 1 and a high reliable mounting part 2 will be described. In the first embodiment, the example of the case in which the large-capacity logic mounting part 1 and the high reliable mounting part 2 are physically divided has been described. Meanwhile, in the embodiment illustrated in FIG. 15, a CRAM check circuit corresponding to the high reliable mounting part 2 and a CRAM check circuit corresponding to the large-capacity logic mounting part 1 are provided independently to increase the inspection frequency of a CRAM soft error in the high reliable mounting part 2. However, division of the large-capacity logic mounting part 1 and the high reliable mounting part 2 is programmable.

In this embodiment, in the same kind of memory cell circuits and elements are used in a CRAM of the large-capacity logic mounting part 1 and a CRAM of the high reliable mounting part 2. The division of the CRAM of the large-capacity logic mounting part 1 and the CRAM of the high reliable mounting part 2 may be determined by an address. For example, as illustrated in this drawing, addresses A0 to AN of the CRAM correspond to the large-capacity logic mounting part 1 and a CRAM control part CRMCTL1 executes control of the CRAM. Meanwhile, addresses AN+1 to AM of the CRAM correspond to the high reliable mounting part 2 and a CRAM control part CRMCTL2 executes control of the CRAM.

At this time, transistors configuring the logics and the CRAMs of the large-capacity logic mounting part 1 and the high reliable mounting part 2 are manufactured under the same process rule. For example, a bit capacity size of the CRAM of the high reliable mounting part 2 may be set to $1/10$ to $1/100$ of a bit capacity size of the CRAM of the large-capacity logic mounting part 1 and the check frequency of the CRAM may be increased. Or, if an operation frequency of the CRAM control part CRAMCTL2 is higher than an operation frequency of the CRAM control part CRAM-CTL1, the CRAM check frequency of the high reliable mounting part 2 can be higher than the CRAM check frequency of the large-capacity logic mounting part 1. Of course, it is further effective to combine the two methods. By this configuration, because mounting logic scales (that is, a capacity of the CRAM) of the large-capacity logic mounting part 1 and the high reliable mounting part 2 are variable, the large-capacity logic mounting part 1 and the high reliable mounting part 2 can be used widely.

REFERENCE SIGNS LIST

1 large-capacity logic mounting part
2 high reliable mounting part
CRAMCTL CRAM control part
LUT lookup table
SEL selector
SW switch
FF flip-flop
LS signal level conversion part
FBA, FBB functional block
CMPA, CMPB comparator
TOUT output
ORA output inspection part
TPG test pattern generation circuit
CRAMCTL CRAM control part
MEMBUS memory bus and data transfer bus for CRAM access

The invention claimed is:
1. A programmable logic device, comprising:
a plurality of configuration memories,
wherein the configuration memories are divided into a plurality of areas and are arranged, and
a part of the plurality of areas is set to a high reliable area where reliability of the configuration memory is higher than reliability in the other area, and
wherein the check frequency of the configuration memory in the high reliable area is set to be higher than the check frequency in the other area.

2. The programmable logic device according to claim 1, wherein a thickness of a gate oxide film of a transistor and a cell size in the configuration memory of the high reliable area are set to be larger than a thickness of a gate oxide film of a transistor and a cell size in the configuration memory of the other area.

3. The programmable logic device according to claim 1, wherein an operation part to execute operation processing is provided in the other area and an operation result processing part to process an operation result operated by the operation part is arranged in the high reliable area.

4. The programmable logic device according to claim 1, wherein a multiplexing operation part to multiplex and execute the same operation is provided in the other area and a comparator to compare operation results operated by the multiplexing operation part is arranged in the high reliable area.

5. The programmable logic device according to claim 4, wherein an output inspection part to inspect an output from the comparator is arranged in the high reliable area.

6. The programmable logic device according to claim 4, wherein a plurality of cell columns in which the configuration memories are arranged in series are arranged in the high reliable area, a plurality of comparators are multiplexed and provided, and each of the comparators is arranged in a different cell column of the plurality of cell columns.

7. A logic integration tool for integrating logic into the programmable logic device according to claim 1,
wherein data of logic integrated into the programmable logic device includes an identification tag showing whether a target area where the logic is integrated is the high reliable area or the other area, and
the logic integration tool executes to integrate the logic into the target area, on the basis of the identification tag.

* * * * *